United States Patent
Huang et al.

(10) Patent No.: US 6,972,260 B2
(45) Date of Patent: Dec. 6, 2005

(54) METHOD OF FABRICATING FLASH MEMORY CELL

(75) Inventors: Min-San Huang, Hsinchu (TW); Pin-Yao Wang, Hsinchu (TW)

(73) Assignee: Powerchip Semiconductor Corp., Hsinchu (TW)

(*) Notice: Subject to any disclaimer, the term of this patent is extended or adjusted under 35 U.S.C. 154(b) by 0 days.

(21) Appl. No.: 10/709,469

(22) Filed: May 7, 2004

(65) Prior Publication Data
US 2005/0250335 A1 Nov. 10, 2005

(51) Int. Cl.[7] .......................................... H01L 21/311
(52) U.S. Cl. ..................................... 438/700; 438/734
(58) Field of Search ................................. 438/700, 770, 438/734, 735, 692, 712, 718, 719, 720, 680, 438/257, 263, 264, 267, 381

(56) References Cited

U.S. PATENT DOCUMENTS

| | | | | |
|---|---|---|---|---|
| 5,479,368 A | * | 12/1995 | Keshtbod | 365/185.3 |
| 5,640,031 A | * | 6/1997 | Keshtbod | 257/315 |
| 5,656,544 A | * | 8/1997 | Bergendahl et al. | 438/386 |
| 6,130,453 A | * | 10/2000 | Mei et al. | 257/315 |
| 6,153,471 A | * | 11/2000 | Lee et al. | 438/263 |
| 6,214,667 B1 | * | 4/2001 | Ding et al. | 438/257 |

* cited by examiner

Primary Examiner—David Nhu
(74) Attorney, Agent, or Firm—Jianq Chyun IP Office

(57) ABSTRACT

A method of fabricating a flash memory cell is provided. The method includes providing a substrate and forming a patterned mask layer over the substrate. Using the patterned mask layer as an etching mask, the substrate is etched to form a trench. Thereafter, a first dielectric layer is formed over the substrate and then a first gate and a second gate is formed beside each sidewall of the trench. A first source/drain region is formed in the substrate at the bottom of the trench. A second dielectric layer is formed over the substrate and then a passivation layer is formed over the second dielectric layer. Afterwards, a portion of the passivation layer, the second dielectric layer and the first dielectric layer are removed. A third gate is formed in the trench and then the mask layer is removed. A third dielectric layer is formed on the substrate. Thereafter, a fourth and a fifth gate are formed beside the respective sidewall of the first gate and the second gate. A second source/drain region is formed in the substrate on each side of the fourth and the fifth gate.

23 Claims, 12 Drawing Sheets

METHOD OF FABRICATING FLASH MEMORY CELL

BACKGROUND OF INVENTION

1. Field of the Invention

The present invention relates to a semiconductor device and a method of manufacturing the same. More particularly, the present invention relates to a flash memory cell and a method of manufacturing the same.

2. Description of Related Art

Flash memory is a memory device that allows multiple data writing, reading, and erasing operations. In addition, the stored data will be retained even after power to the device is removed. With these advantages, it has been broadly applied in personal computer and electronic equipment.

A typical flash memory device has a floating gate and a control gate fabricated using doped polysilicon (the so-called stack gate structure). The control gate is set above the floating gate with an inter-gate dielectric layer separating the two. Furthermore, a tunneling oxide layer is also set between the floating gate and an underlying substrate.

To write data into the flash memory, a bias voltage is applied to the control gate and the source/drain regions so that an electric field is generated to inject electrons into the floating gate. To read data from the flash memory, an operating voltage is applied to the control gate. Since the entrapment of charges inside the floating gate will directly affect the on/off status of the underlying channel, the on/off status of the channel can be construed as a data value of "1" or "0". Finally, to erase data from the flash memory, the relative potential between the substrate, the source region, the drain region or the control gate is raised. Hence, tunneling effect can be utilized to transfer electrons from the floating gate to the substrate or drain (source) via the tunneling oxide layer (the so-called substrate erase or drain (source) side erase) or from the floating gate to the control gate via the inter-gate dielectric layer.

However, it is difficult to control the flow of electrons from the floating gate when data within a flash memory cell is erased. Thus, too much positive charge may be ejected from the floating gate leading to a phenomenon called over-erase. When over-erase is really significant, the channel underneath the floating gate may conduct even if no operating voltage is applied to the control gate. In other words, the channel permanently conducts leading to the production of incorrect data. To minimize over-erase phenomenon, many types of flash memories have a split gate design. Aside from a control gate and a floating gate, the split gate flash memory cell has a select gate (or an erase gate) above the substrate beside each sidewall of the control gate and the floating gate. The select gate is isolated from the control gate, the floating gate and the substrate through another inter-gate dielectric layer. When over-erase is significant, that is, the channel underneath the floating gate is conductive in the absence of an operating voltage applied to the control gate, the channel underneath the select gate remains off. With the select gate in a off mode, the drain region and the source region are non-conductive so that misreading of data is prevented.

However, because a split gate design demands a bigger split gate area and a larger memory cell size, a split gate memory cell is more bulky than a convention stack gate memory cell. Ultimately, the level of integration cannot be further increased.

Furthermore, performance of the flash memory is closely related to the gate coupling ratio (GCR) between the floating gate and the control gate and the gate coupling ratio is dependent on the included area between the control gate and the floating gate. Therefore, if the included area between the control gate and the floating gate is large, the gate-coupling ratio is high resulting in a better device performance. Yet, increasing the included area between the control gate and the floating gate is more and more difficult when the level of integration is high.

FIG. 1 is a schematic cross-sectional view of a flash memory cell structure as disclosed in U.S. Pat. No. 6,130,453. As shown in FIG. 1, the memory cell is formed within a trench in a silicon substrate 20 in order to increase the level of device integration. The memory cell includes two vertical floating gates 31a and 31b, a vertical bit line 32, spacers 25, a drain region 27, a source region 28, a silicon oxide cap layer 24 and a control gate (word line) 33.

FIGS. 2A through 2D are schematic cross-sectional views showing the steps for fabricating a flash memory cell as disclosed in U.S. Pat. No. 6,130,453. As shown in FIG. 2A, a substrate 20 having a thick patterned gate oxide layer 21 and a silicon nitride dielectric layer 23 that expose a trench 40 is provided. Thereafter, a thin gate oxide layer 22 is formed on the surface of the trench 30 and then polysilicon material is deposited into the trench 40 to form a polysilicon layer 31.

As shown in FIG. 2B, a source region 28 is formed in the substrate 20 on each side of the area reserved for forming a gate structure (that is, the trench 40). Thereafter, a reactive ion etching (RIE) operation is carried out to form a first floating gate 31a and a second floating gate 31b on the respective sidewalls of the trench 40. In the process, a trench 42 is also formed.

As shown in FIG. 2C, silicon nitride material is deposited on the surface of the trench 42 to form a silicon nitride layer 25. As shown in FIG. 2D, an oxidation process is carried out and then the silicon nitride layer 25 is etched to form silicon nitride spacers 25a. Thereafter, a drain region 27 is formed in the substrate 20 at the bottom of the trench 42. Finally, polysilicon material is deposited into the trench 42 to form a polysilicon bit line 32.

According to the method disclosed in U.S. Pat. No. 6,130,453, the spacers 25a between the floating gates 31a, 31b and the bit line 32 are formed by depositing dielectric material after forming the floating gates 31a, 31b but before forming the bit line 32. After forming the dielectric layer (the silicon nitride layer 25), an oxidation process is carried out followed by performing a reactive ion etching process to remove the dielectric layer at the bottom of the trench and expose the substrate 20.

However, in the process of removing the dielectric layer at the bottom of the trench, a portion of the dielectric layer attached to the sidewalls is also removed or etched. Hence, the performance of the memory cell is likely to be adversely affected.

SUMMARY OF INVENTION

Accordingly, the present invention is directed to a method of fabricating a flash memory cell capable of avoiding a deterioration of memory cell performance caused by a defective dielectric layer.

According to an embodiment of the invention, a method of fabricating a flash memory cell is provided. First, a substrate is provided. Thereafter, a patterned mask layer is formed over the substrate. Using the patterned mask layer as an etching mask, the substrate is etched to form a trench. A first dielectric layer is formed over the substrate. A first gate and a second gate are formed on the respective sidewall of the trench. The first gate and the second gate are at a distance from each other. Furthermore, the first and the second gates expose a portion of the first dielectric layer at the bottom of the trench. A first source/drain region is then formed in the substrate at the bottom of the trench. Thereafter, a second dielectric layer is formed over the substrate and then a passivation layer is formed over the second dielectric layer. The passivation layer is formed using a semiconductor material or a conductive material. A portion of the passivation layer, the second dielectric layer and the first dielectric layer are removed to expose the substrate surface at the bottom of the trench. A third gate that completely fills the trench is formed. After removing the mask layer, a third dielectric layer is formed over the substrate. A fourth and a fifth gate are formed beside the respective sidewall of the first gate and the second gate. Finally, a second source/drain region is formed in the substrate on one side of the fourth and the fifth gate respectively.

In the present invention, an undoped polysilicon passivation layer is formed over the second dielectric layer. When a subsequent process (an etching process) for removing the material at the bottom of the trench to expose the substrate is carried out, the passivation layer is capable of protecting the second dielectric layer against possible damage. Hence, the flash memory cell can have an improved data retention capacity.

According to another embodiment of the present invention, an alternative method of fabricating a flash memory cell is provided. First, a substrate having a liner layer and a mask layer with an opening thereon and a trench in the substrate located within the opening is provided. Thereafter, a tunneling oxide layer is formed on the surface of the trench. A conductive layer fills the interior of the trench and the conductive layer is etched back to produce a conductive layer having a top section above the surface of the liner layer but lower than the surface of the mask layer. Thereafter, a pair of spacers is formed on the respective sidewall of the trench so that a portion of the conductive layer is covered. Using the spacers and the mask layer as an etching mask, a portion of the conductive layer is removed to form a first floating gate and a second floating gate beside the respective sidewall of the trench. A first source/drain region is formed in the substrate at the bottom of the trench. Next, a first inter-gate dielectric layer is formed on the surface of the substrate and the trench and then a passivation layer is formed on the first inter-gate dielectric layer. The passivation layer is fabricated using a semiconductor material or a conductive material. Thereafter, a portion of the passivation layer, the first inter-gate dielectric layer and the tunneling oxide layer are removed to expose the substrate surface at the bottom of the trench. A control gate that completely fills the trench is formed. The top section of the control gate is at a level higher than the top section of the first floating gate and the second floating gate. After removing the liner layer and the mask layer, a second inter-gate dielectric layer is formed over the substrate. A first select gate and a second select gate are formed beside the respective sidewall of the spacers, the first floating gate and the second floating gate. Finally, a second source/drain region is formed in the substrate on one side of the first select gate and the second select gate respectively.

In an embodiment of the present invention, an undoped polysilicon passivation layer is formed over the first inter-gate dielectric layer. When a subsequent process (an etching process) for removing the material at the bottom of the trench to expose the substrate is carried out, the passivation layer is capable of protecting the first inter-gate dielectric layer against possible damage. Hence, the flash memory cell can have an improved data retention capacity.

In an embodiment of the present invention, the first floating gate (or the second floating gate) and the control gate are formed in the trench within the substrate. Hence, size of the memory cell can be reduced and the level of integration can be increased. Furthermore, the included area between the first floating gate (or the second floating gate) and the control gate is related to the depth of the trench. Therefore, by forming a deeper trench, the included area between the first floating gate and the control gate is increased. With a larger included area, the gate-coupling ratio is increased leading to an increase in operating speed and performance of the device. Moreover, the length of the channel corresponds to the depth of the trench. Thus, abnormal punch-through between the first source/drain region and the second source/drain region can be avoided by forming a trench with a desirable depth.

In addition, the method of fabricating the flash memory cell according to an embodiment of the present invention is capable of forming the common control gate that controls two memory cells at the same time. In other words, the first floating gate, the first select gate and the control gate together constitute a memory cell while the second floating gate, the second select gate and the control gate constitute another memory cell. Hence, the level of integration is increased and the production cost of the memory device is reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The following drawings illustrate embodiments of the invention and, together with the description, serve to explain the principles of the invention.

DETAILED DESCRIPTION

Figure 1:
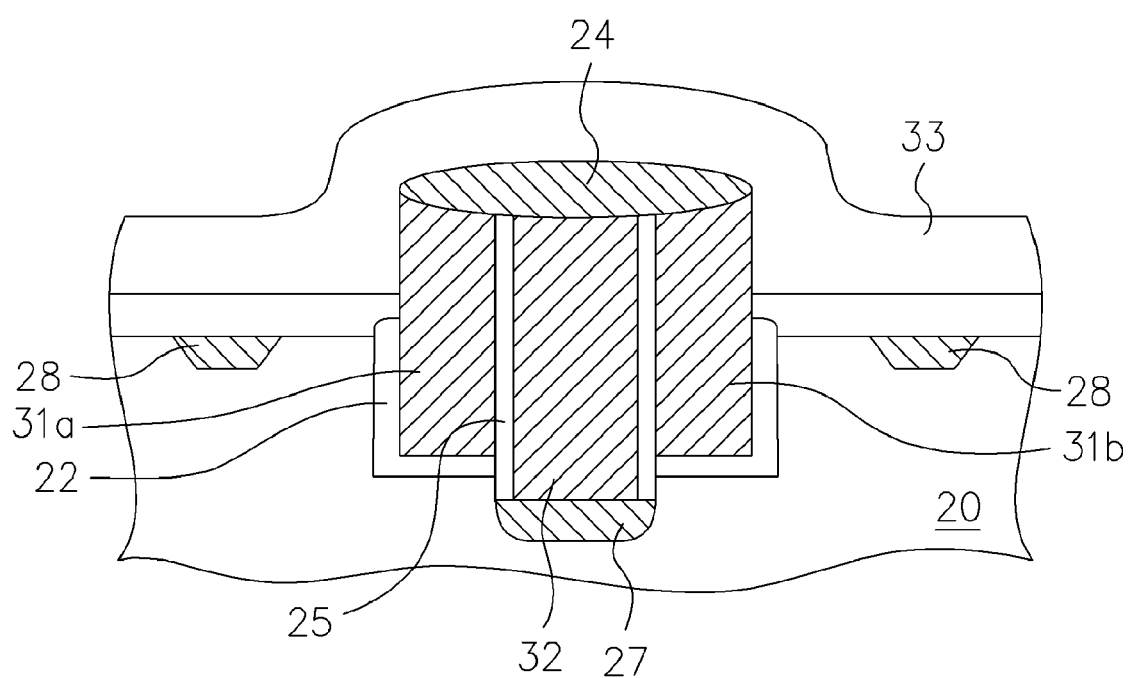
FIG. 1 is a schematic cross-sectional view of a conventional flash memory cell structure.
Figure 2A:
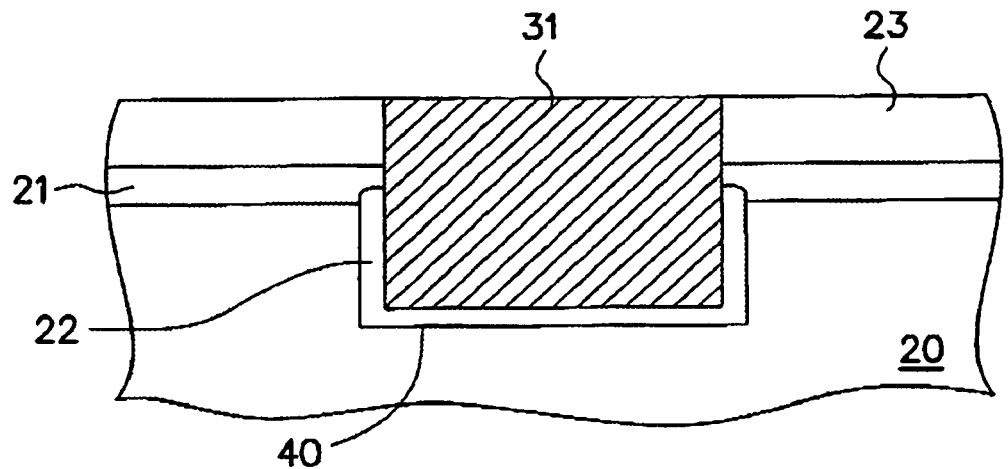
FIGS. 2A through 2D are schematic cross-sectional views showing the steps of fabricating a conventional flash memory cell.
Figure 2B:
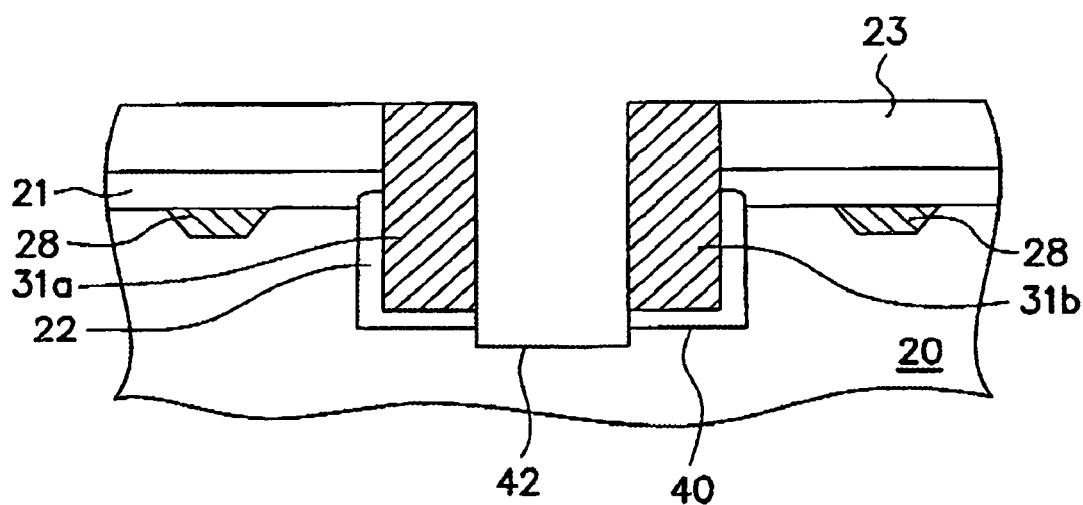
Figure 2C:
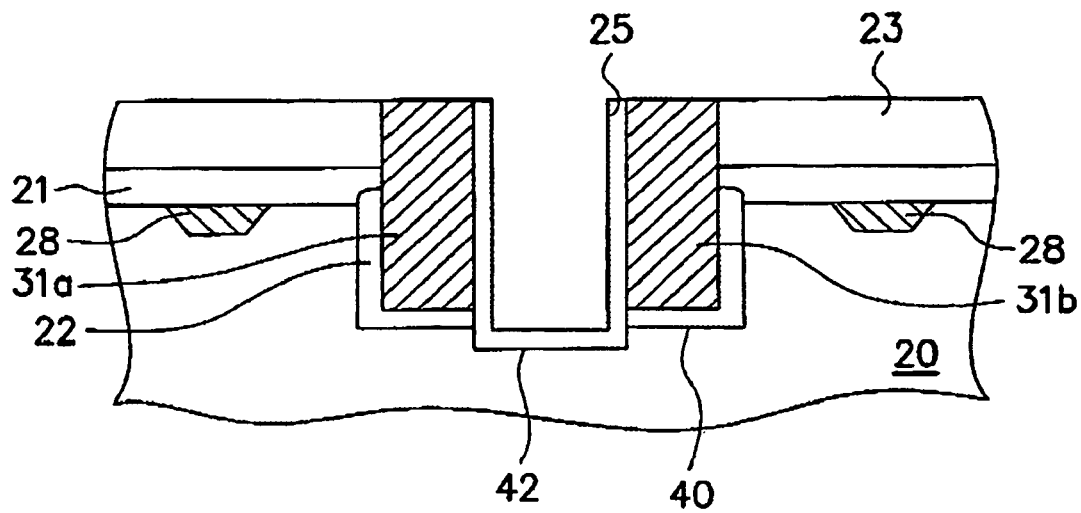
Figure 2D:
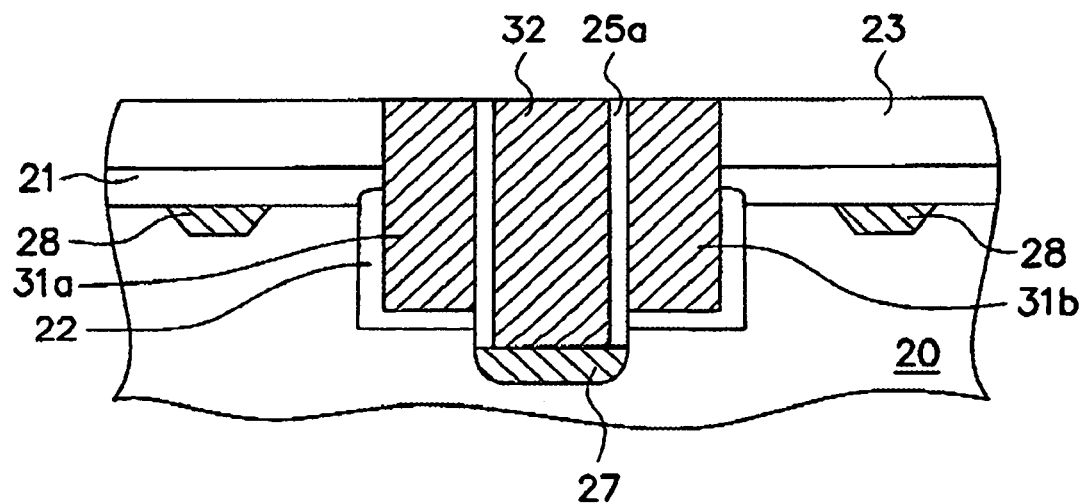

Reference will now be made in detail to the present preferred embodiments of the invention, examples of which are illustrated in the accompanying drawings. Wherever possible, the same reference numbers are used in the drawings and the description to refer to the same or like parts.

Figure 3A:
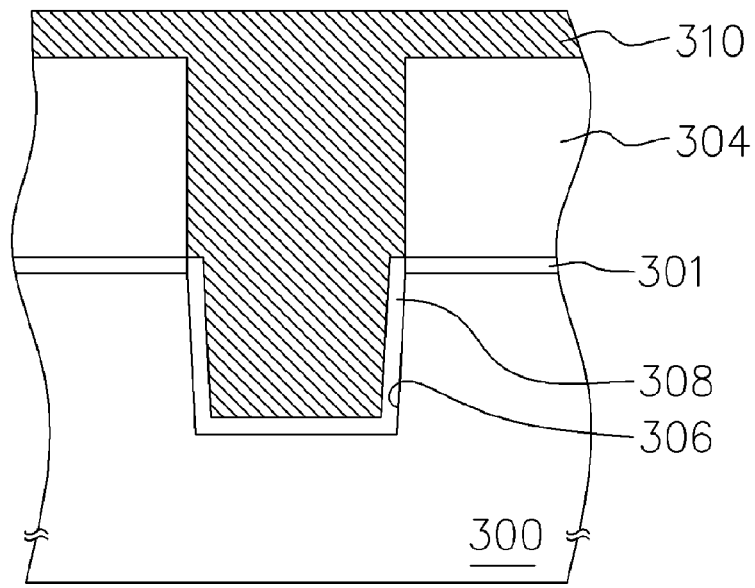
FIGS. 3A through 3J are schematic cross-sectional views showing the steps of fabricating a flash memory cell according to one embodiment of the present invention.

FIGS. 3A through 3J are schematic cross-sectional views showing the steps of fabricating a flash memory cell according to one embodiment of the present invention. As shown in FIG. 3A, a substrate 300 having at least a device isolation structure (not shown) thereon is provided. The device isolation structure has a linear layout for defining an active region. The device isolation structure is formed, for example, by performing a local oxidation (LOCOS) or performing the well known process steps necessary for forming a shallow trench isolation (STI) structure.

A dielectric layer 301 is formed over the substrate 300. The dielectric layer 301 includes a silicon oxide layer formed, for example, by performing a chemical vapor deposition (CVD) process. In an alternative preferred embodiment, a thinner liner layer (not shown) is formed over the surface of the substrate by performing a thermal oxidation process. Thereafter, a patterned mask layer 304 is formed over the dielectric layer 301. The patterned mask layer 304 includes a silicon nitride layer formed, for example, by depositing a mask material layer in a chemical vapor deposition process and then performing a photolithographic/etching process. Using the patterned mask layer 304 as an etching mask, the substrate 300 is etched to form a trench 306 in the substrate 300.

Then, a first dielectric layer is formed over the substrate 300. The first dielectric layer is formed, for example, by forming a tunneling oxide layer 308 on the surface of the trench 306. The tunneling oxide layer 308 includes a silicon oxide layer formed by a thermal oxidation process, for example. Thereafter, a conductive layer 310 is formed to fill the trench 306 by depositing doped polysilicon in a chemical vapor deposition process and then implanting ions into the undoped polysilicon layer.

Figure 3B:
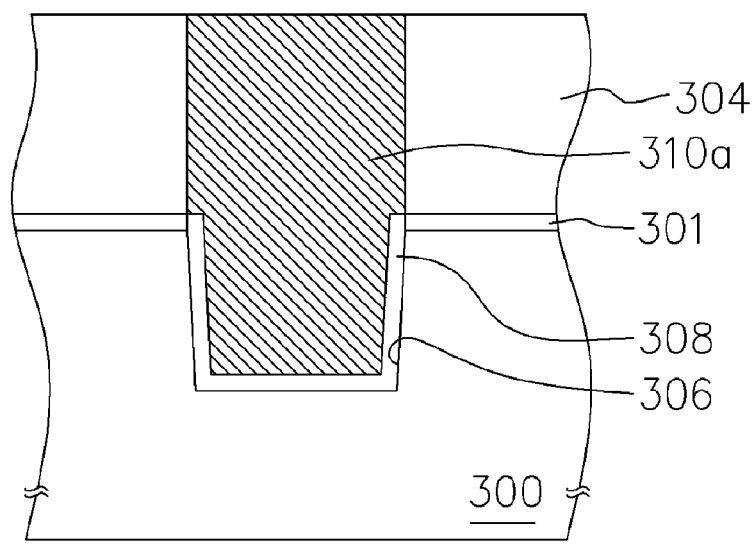
Figure 3C:
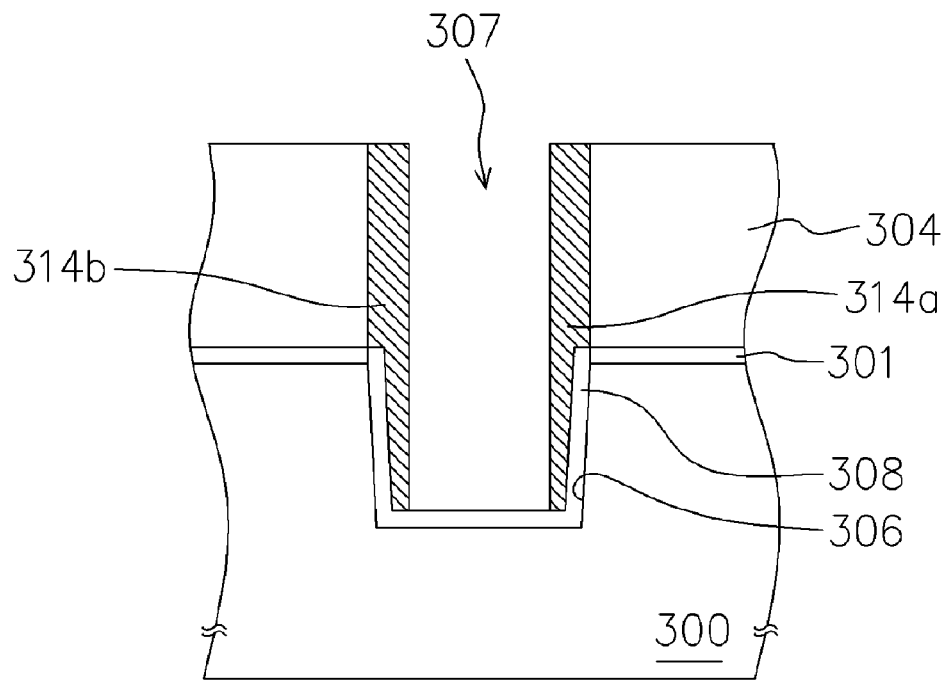
Figure 3D:
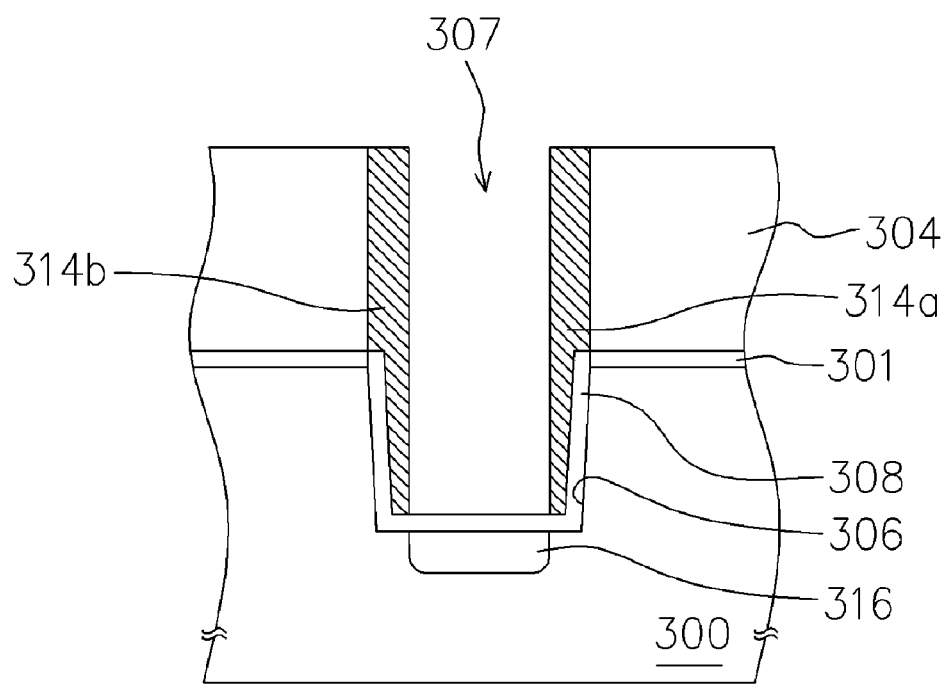

As shown in FIG. 3B, the conductive layer 310 (shown in FIG. 3A) on the surface of the mask layer 304 is removed to form a conductive layer 310a in the trench 306. The conductive layer 310 (shown in FIG. 3A) above the mask layer 304 can be removed by etching back in a chemical-mechanical polishing operation, for example. Thereafter, a photolithographic and etching process (a patterning process) are carried out to form a trench 307 in the conductive layer 310a so that a pair of floating gates 314a and 314b are formed as shown in FIG. 3C. Afterwards, ions are implanted into the substrate 300 at the bottom of the trench 307 to form a first source/drain region 316 as shown in FIG. 3D.

Figure 3E:
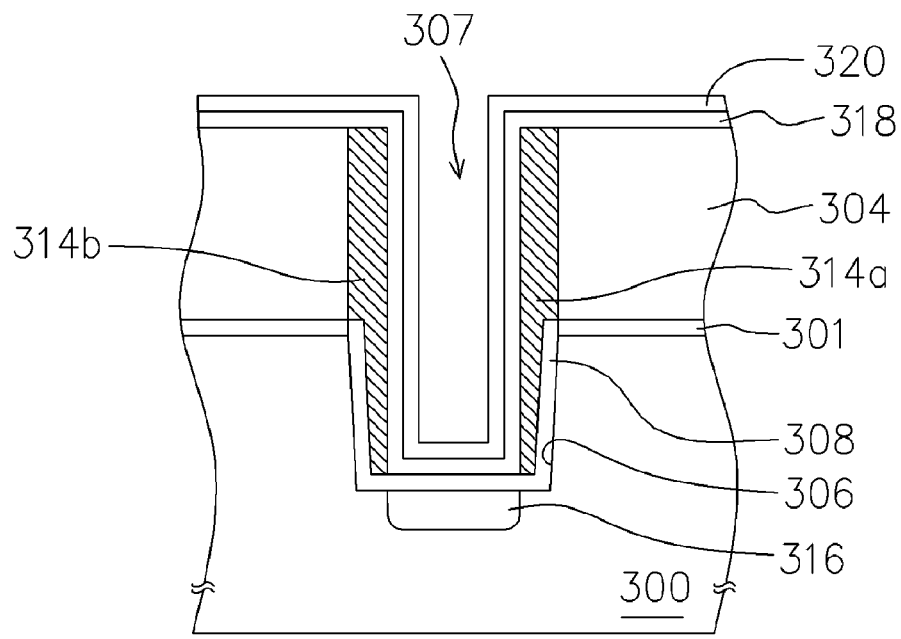

As shown in FIG. 3E, a second dielectric layer is formed over the substrate 300. For example, an inter-gate dielectric layer 318 such as an oxide/nitride/oxide composite layer is formed over the mask layer 304 and the surface of the trench 307. Thereafter, a passivation layer 320 is formed over the inter-gate dielectric layer 318. The passivation layer 320 is formed of a semiconductor material or a conductive material. For example, the passivation layer 320 is formed of polysilicon. The passivation layer 320 having a thickness of about 100 Å is formed, for example, by performing a chemical vapor deposition.

Figure 3F:
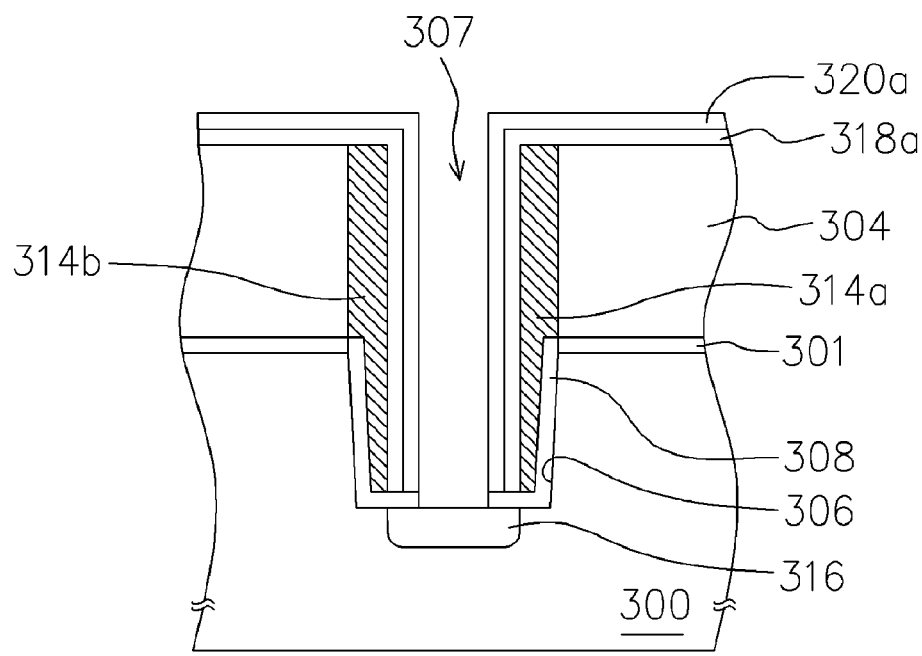

As shown in FIG. 3F, a portion of the tunneling oxide layer 308, the inter-gate dielectric layer 318 and the passivation layer 320 are removed until a portion of the substrate 300 is exposed at the bottom of the trench 307 and forming an inter-gate dielectric layer 318a and a passivation layer 320a. The method of removing the tunneling oxide layer 308, the inter-gate dielectric layer 318 and the passivation layer 320 at the bottom of the trench 307 includes an anisotropic etching process (for example, a dry etching process). It should be noted that the inter-gate dielectric layer 318 disposed on the sidewalls of the trench 307 remains intact after the aforementioned process (the etching process) because the passivation layer 320 covers and protects the inter-gate dielectric layer 318.

Figure 3G:
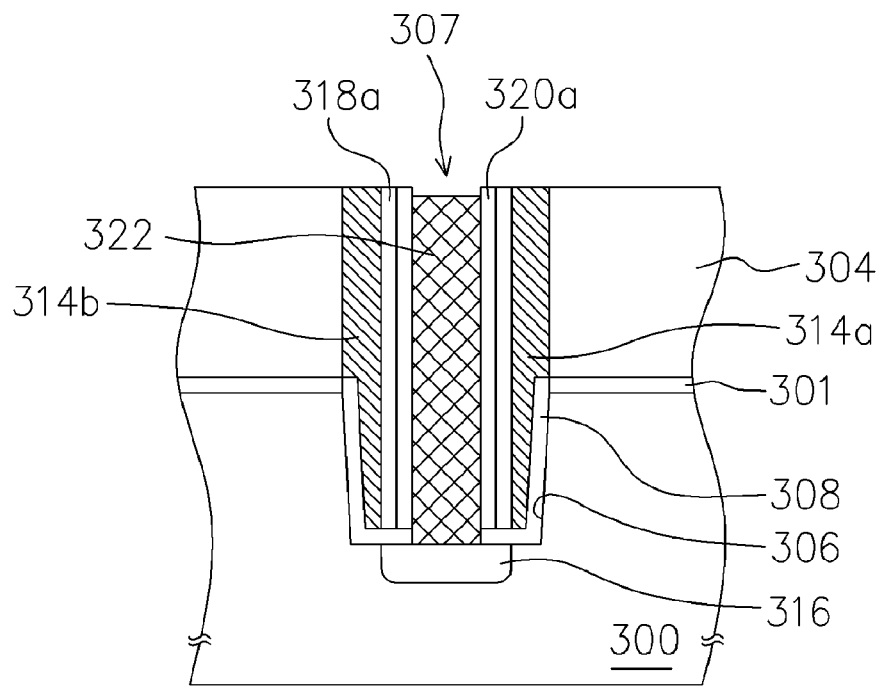

As shown in FIG. 3G, a control gate 322 is formed within the trench 307 in the substrate 300. The control gate 322 is a layer of doped polysilicon material, for example.

Figure 3H:
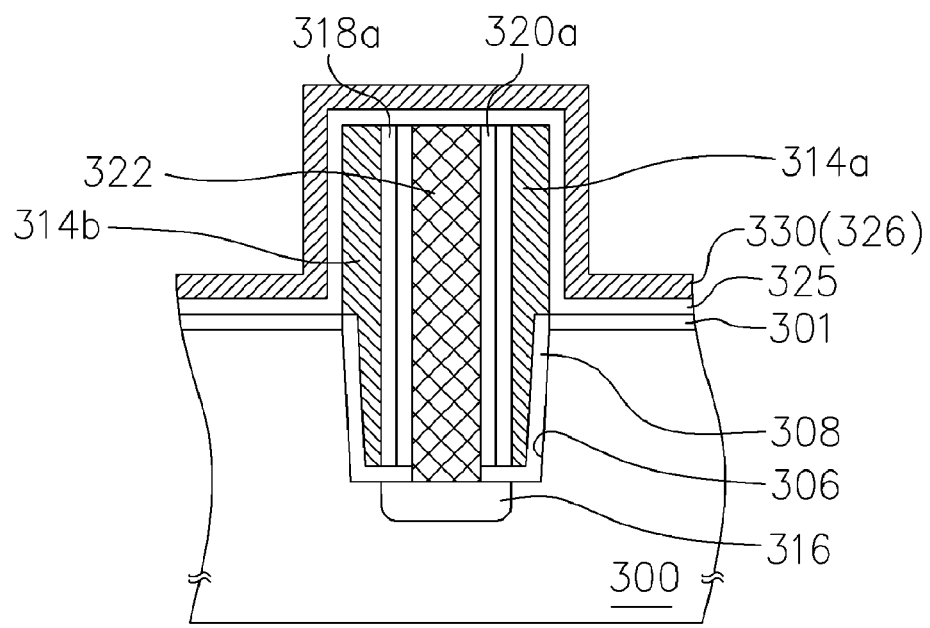

As shown in FIG. 3H, the mask layer 304 is removed. It should be noted that both the mask layer 304 and the liner layer are removed in the aforementioned step if a liner layer is formed over the substrate in FIG. 3A. Thereafter, a third dielectric layer such as an inter-gate dielectric layer 325 is formed over the substrate 300 covering the entire structure. The inter-gate dielectric layer 325 is a silicon oxide layer, for example.

Thereafter, a conductive layer 330 is formed over the inter-gate dielectric layer 325. In this embodiment, the conductive layer 330 is a doped polysilicon layer 326, for example. However, in an alternative embodiment, the conductive layer 330 is a composite layer including a doped polysilicon layer and a silicide layer.

Figure 3I:
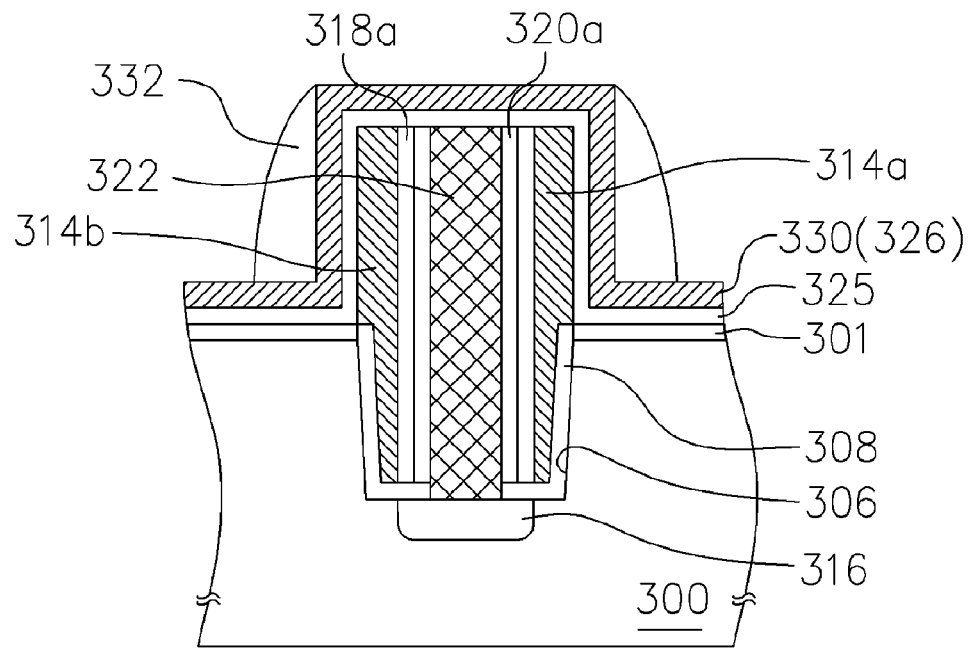

As shown in FIG. 3I, spacers 332 are formed beside the respective sidewall of the floating gate 314a and the floating gate 314b.

Figure 3J:
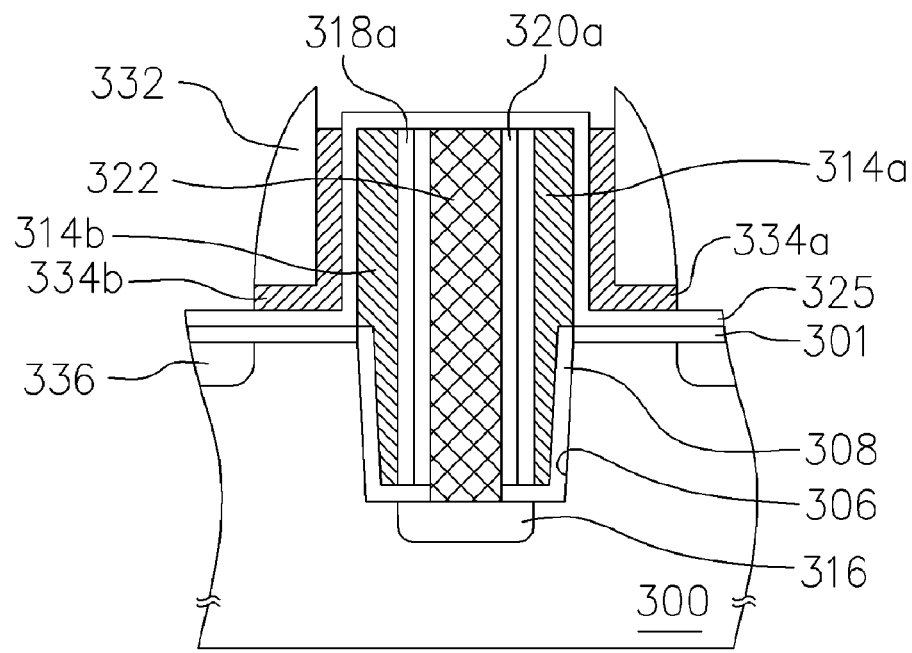

As shown in FIG. 3J, using the spacers 332 as a self-aligned mask, a portion of the conductive layer 330 is removed so that select gates 334a and 334b are formed beside the respective sidewall of the floating gate 314a and 314b. The conductive layer 330 is removed, for example, by performing an anisotropic etching process. Finally, a second source/drain region 336 is formed in the substrate 300 beside the select gate 334a and the select gate 334b, thereby completing the fabrication of a pair of memory cells with a common control gate 322. The second source/drain region 336 is formed, for example, by implanting ions into the substrate 300.

In the aforementioned embodiment of the present invention, an undoped polysilicon passivation layer 320 is formed over the inter-gate dielectric layer 318. Hence, the passivation layer 320 can protect the inter-gate dielectric layer 318 from being damaged when an etching process is performed to remove the material at the bottom of the trench 307 to expose the substrate 300. With such protection, the flash memory cell can have a better data retention capability. Furthermore, the undoped polysilicon passivation layer 320 can serve as a buffer interface between the inter-gate dielectric layer 318 and the control gate 322. Moreover, the passivation layer 320 and the control gate 322 are formed by using the same material so that the two can be combined to form a single gate without additional processing steps.

Figure 4A:
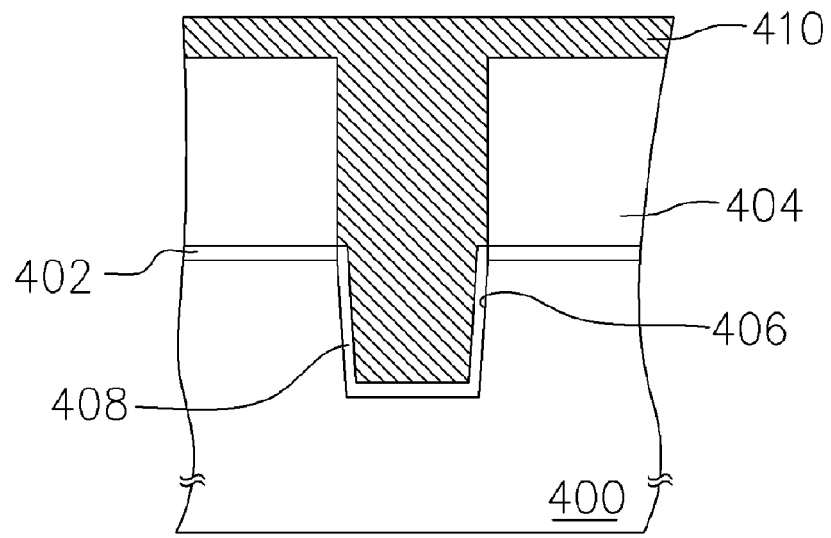
FIGS. 4A through 4G are schematic cross-sectional views showing the steps of fabricating a flash memory cell according to another embodiment of the present invention.

FIGS. 4A through 4G are schematic cross-sectional views showing the steps of fabricating a flash memory cell according to another embodiment of the present invention. As shown in FIG. 4A, a substrate 400 having at least a device isolation structure (not shown) thereon is provided. The device isolation structure has a linear layout for defining an active region. The device isolation structure is formed, for example, by performing a local oxidation (LOCOS) or performing the steps necessary for forming a shallow trench isolation (STI) structure.

A liner layer 402 is formed over the surface of the substrate 400. The liner layer 402 includes a silicon oxide formed, for example, by performing a thermal oxidation process. In an alternative embodiment, a dielectric layer (not shown) is formed over the surface of the substrate 400 by performing a chemical vapor deposition process, for example. Thereafter, a mask layer 404 is formed over the liner layer 402. The mask layer 404 includes a silicon nitride layer formed, for example, by performing a chemical vapor deposition process. The mask layer 404, the liner layer 402 and the substrate 400 are patterned to form a trench 406 in the substrate 400.

A tunneling oxide layer 408 is formed on the surface of the trench 406. The tunneling oxide layer 408 is a silicon oxide layer formed, for example, by performing a thermal oxidation process. Thereafter, conductive material is deposited into the trench 406 and over the mask layer to form a conductive layer 410. The conductive layer 410 is fabricated using a doped polysilicon material. The conductive layer 410 is formed by forming an undoped polysilicon layer over the substrate 400 with a chemical vapor deposition process and then implanting ions into the undoped polysilicon layer.

Figure 4B:
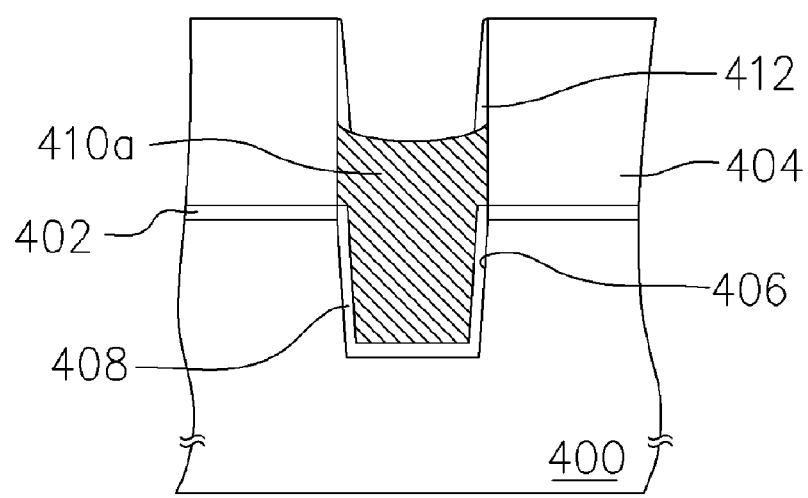

As shown in FIG. 4B, an etching back process is carried out to remove a portion of the conductive layer 410. Hence, a conductive layer 410a is retained within the trench 406 such that the top section of the conductive layer 410a is at a level higher than the upper surface of the liner layer 402 but at a level lower than the upper surface of the mask layer 404. Thereafter, spacers 412 are formed on the respective sidewall of the trench 406 covering a portion of the upper surface of the conductive layer 410a. The spacers 412 are fabricated using a material having an etching selectivity different from the conductive layer 410a. The spacers 412 are formed, for example, by depositing insulating material to form an insulation layer (not shown) and then performing an anisotropic etching process to remove a portion of the insulation layer.

Figure 4C:
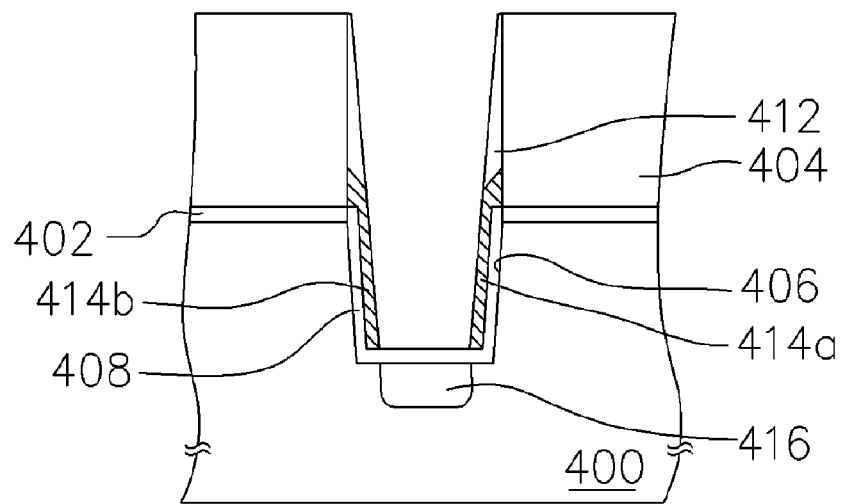

As shown in FIG. 4C, using the mask layer 404 and the spacers 412 as an etching mask, a portion of the conductive layer 410a is removed to form a first floating gate 414a and a second floating gate 4141b beside the respective sidewall of the trench 406. Thereafter, a first source/drain region 416 is formed in the substrate 400 at the bottom of the trench 406. The first source/drain region 416 is formed, for example, by implanting ions into the substrate 400.

Figure 4D:
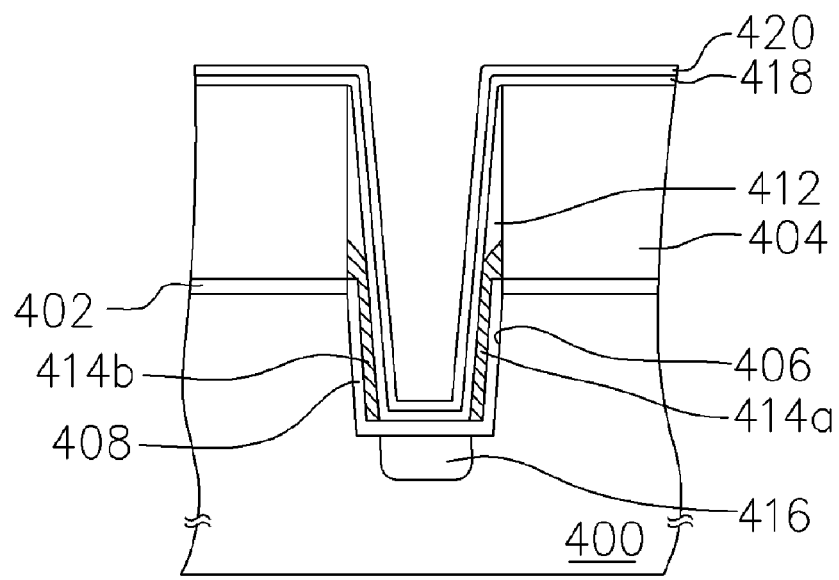

As shown in FIG. 4D, an inter-gate dielectric layer 418 is formed over the substrate 400 and the surface of the trench 406. The inter-gate dielectric layer 418 is an oxide/nitride/oxide composite layer, for example. Thereafter, a passivation layer 420 is formed over the inter-gate dielectric layer 418. The passivation layer 420 is an undoped polysilicon layer having a thickness of about 100 Å and is formed, for example, by a chemical vapor deposition process.

Figure 4E:
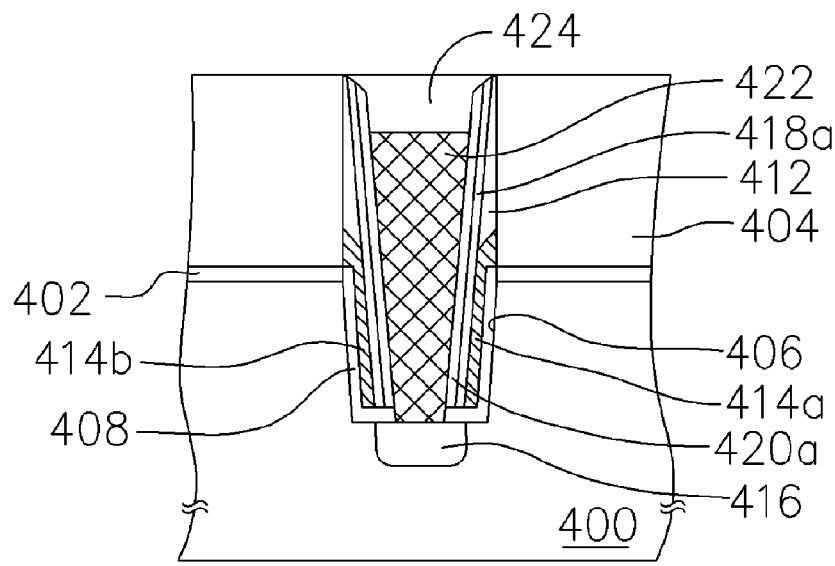

As shown in FIG. 4E, portions of the tunneling oxide layer 408, the inter-gate dielectric layer 418 and the passivation layer 420 are removed. Thus, a portion of the substrate 400 at the bottom of the trench 406 is exposed and an inter-gate dielectric layer 418a and a passivation layer 420a are formed. The method of removing portions of the tunneling oxide layer 408, the inter-gate dielectric layer 418 and the passivation layer 420 includes performing an anisotropic etching process (for example, a dry etching process). It should be noted that the inter-gate dielectric layer 418 disposed on the sidewalls of the trench 406 remains intact after the aforementioned process (the etching process) because the passivation layer 420 covers and protects the inter-gate dielectric layer 418.

A control gate 422 is formed within the trench 406. The top section of the control gate 422 is at a level higher than the top section of the floating gates 414a and 414b. The control gate 422 is fabricated using doped polysilicon material, for example. Thereafter, a cap layer 424 fills the trench 406 and covers the control gate 422.

Figure 4F:
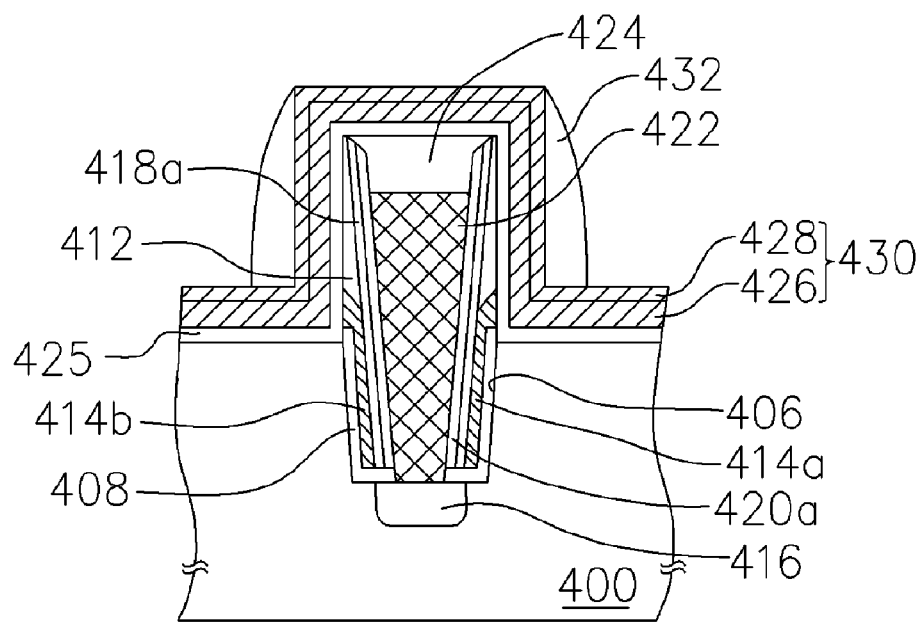

As shown in FIG. 4F, the liner layer 402 and the mask layer 404 are removed. It should be noted that only the mask layer 404 must be removed if a thick dielectric layer instead of a liner layer 402 is formed over the substrate 400 in FIG. 4A. Thereafter, an inter-gate dielectric layer 425 is formed over the substrate 400 to cover the substrate 400 and the surface structures on the substrate 400. The inter-gate dielectric layer 425 is fabricated using silicon oxide material, for example.

Thereafter, a conductive layer 430 is formed over the inter-gate dielectric layer 425. In this embodiment, the conductive layer 430 is a doped polysilicon layer 426 or a composite layer including a doped polysilicon layer 426 and a metal silicide layer 428, for example. After that, spacers 432 are formed beside the respective sidewall of the spacers 412, the first floating gate 414a and the second floating gate 414b.

Figure 4G:
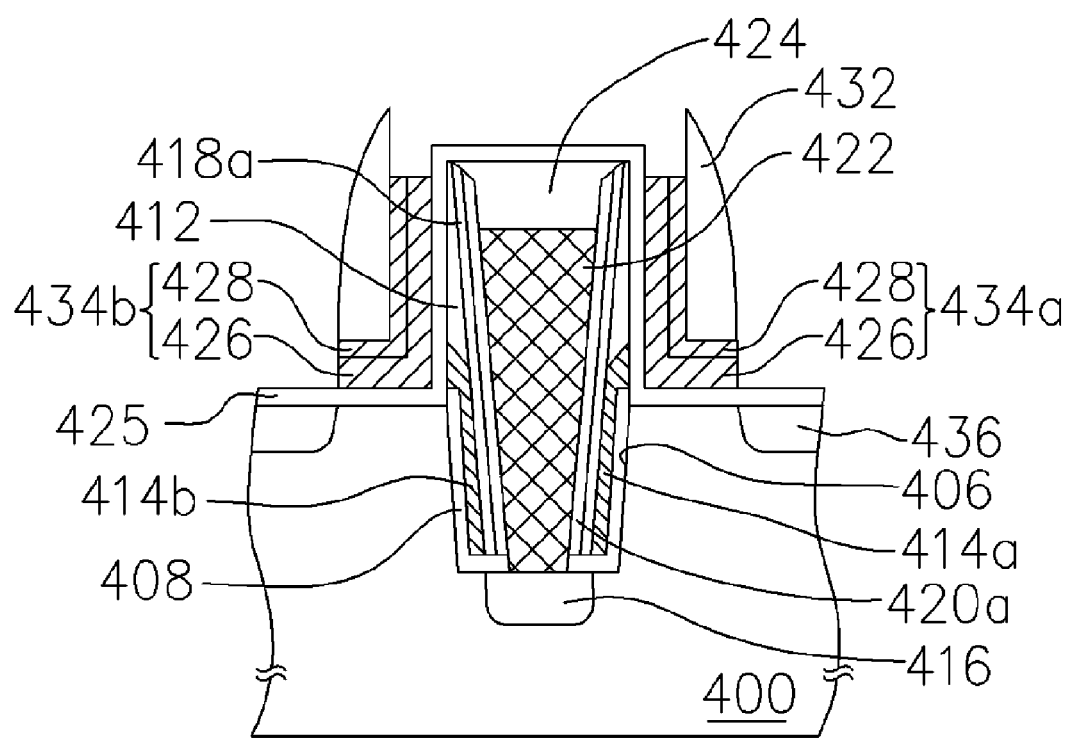

As shown in FIG. 4G, using the spacers 432 as a self-aligned mask, a portion of the conductive layer 430 (the dope polysilicon layer 426 and the silicide layer 428) is removed to form a first select gate 434a and a second select gate 434b beside the respective sidewall of the spacers 412, the first floating gate 414a and the second floating gate 414b. The conductive layer 430 is removed by performing an anisotropic etching process, for example. Thereafter, a second source/drain region 436 is formed in the substrate 400 on one side of the first select gate 434a and the second gate 434b respectively so that a pair of memory cells having the same control gate 422 is produced. The second source/drain region 436 is formed, for example, by implanting ions into the substrate 400.

In an alternative embodiment, additional spacers (not shown) are formed beside the respective sidewall of the first select gate 434a and the second select gate 434b to facilitate the fabrication of a lightly doped drain (LDD) structure or a contact window.

In the aforementioned embodiment of the present invention, an undoped polysilicon passivation layer 420 is formed over the inter-gate dielectric layer 418. Hence, the passivation layer 420 is capable of protecting the inter-gate dielectric layer 418 against any damage when an etching process for removing the material at the bottom of the trench 406 to expose the substrate 400 is carried out. With such protection, the flash memory cell can have a better data retention capability. Furthermore, the undoped polysilicon passivation layer 420 can serve as a buffer interface between the inter-gate dielectric layer 418 and the control gate 422. Moreover, the passivation layer 420 and the control gate 422 are fabricated using an identical material so that the two can be combined to form a single gate without any need for further processing.

In the present invention, the floating gate and the control gate are formed in the trench within the substrate. Hence, size of the memory cell can be reduced and the level of integration can be increased. Furthermore, the included area between the floating gate and the control gate is related to the depth of the trench. Therefore, by forming a deeper trench, the included area between the first floating gate and the control gate is increased. With a larger included area, the gate-coupling ratio is increased leading to an increase in operating speed and performance of the device. Moreover, length of the channel is also related to depth of the trench. Thus, abnormal punch-through between the first source/drain region and the second source/drain region can be avoided by forming a deeper trench.

In addition, the method of fabricating the flash memory cell according to the embodiment of the present invention is capable of forming a common control gate that controls two memory cells at the same time as shown in FIG. 4G. In other words, the first floating gate 414a, the first select gate 434a and the control gate 422 together constitute a memory cell while the second floating gate 414b, the second select gate 434b and the control gate 422 constitute another memory cell. Hence, the level of integration is increased and the production cost of the memory device is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory cell, comprising the steps of:
   providing a substrate;
   forming a patterned mask layer over the substrate;
   etching the substrate using the patterned mask layer as an etching mask to form a trench in the substrate;
   forming a first dielectric layer over the substrate;
   forming a first gate and a second gate beside respective sidewalls of the trench,
   wherein the first gate and the second gate are at a distance from each other and expose a portion of the first dielectric layer at a bottom of the trench;
   forming a first source/drain region in the substrate at the bottom of the trench;
   forming a second dielectric layer over the substrate;
   forming a passivation layer over the second dielectric layer;
   removing a portion of the passivation layer, the second dielectric layer and the first dielectric layer to expose a substrate surface at the bottom of the trench;
   forming a third gate that completely fills the trench;
   removing the patterned mask layer;
   forming a third dielectric layer over the substrate;
   forming a fourth gate and a fifth gate beside respective sidewalls of the first gate and the second gate; and
   forming a second source/drain region in the substrate on one side of the fourth gate and the fifth gate.

2. The method of claim 1, wherein a material constituting the passivation layer comprises a semiconductor material or a conductive material.

3. The method of claim 1, wherein a material constituting the passivation layer comprises undoped polysilicon.

4. The method of claim 3, wherein the step of forming the passivation layer comprises performing a chemical vapor deposition process.

5. The method of claim 3, wherein the passivation layer has a thickness of about 100 Å.

6. The method of claim 1, wherein a material constituting the first gate, the second gate, the third gate, the fourth gate and the fifth gate comprises undoped polysilicon.

7. The method of claim 1, wherein the first gate and the second gate are floating gates, the third gate is a control gate, and the fourth gate and the fifth gate are select gates.

8. The method of claim 1, wherein each of the fourth gate and the fifth gate comprises a doped polysilicon layer and a metal silicide layer.

9. The method of claim 1, wherein the first dielectric layer is a tunneling oxide layer and the second dielectric layer and the third dielectric layer are both inter-gate dielectric layers.

10. The method of claim 1, wherein the step of forming the first gate and the second gate on respective sidewalls of the trench comprises:
    depositing a conductive material into the trench to form a conductive layer;
    performing an etching back operation so that a top section of the conductive layer is at a level lower than a surface of the patterned mask layer;
    forming spacers on the sidewalls of the trench so that a portion of the conductive layer is covered; and
    removing a portion of the conductive layer using the spacers and the patterned mask layer as an etching mask to form the first gate and the second gate beside the respective sidewalls of the trench.

11. The method of claim 1, wherein the step of forming the first gate and the second gate on respective sidewalls of the trench comprises:
    depositing a conductive material into the trench to form a conductive layer;
    removing the conductive layer over an upper surface of the patterned mask layer; and
    patterning the conductive layer to form a first gate and a second gate beside the respective sidewalls of the trench.

12. The method of claim 1, further comprising a step of forming a liner layer over the substrate before the step of forming the patterned mask layer over the substrate, and a step of removing the liner layer during the step of removing the patterned mask layer.

13. The method of claim 12, wherein a material constituting the liner layer comprises silicon oxide and a material constituting the patterned mask layer comprises silicon nitride.

14. The method of claim 1, further comprising a step of forming a fourth dielectric layer over the substrate before the step of forming the patterned mask layer over the substrate.

15. A method of fabricating a flash memory cell, comprising the steps of:
    providing a substrate, having a liner layer and a mask layer formed thereon, wherein an opening is formed in the liner layer and the mask layer and a trench is formed in the substrate below the opening;
    forming a tunneling oxide layer on a surface of the trench;
    depositing a conductive material into the trench to form a conductive layer;
    performing a etching back process so that a top section of the conductive layer is at a level higher than an upper surface of the liner layer but lower than an upper surface of the mask layer;
    forming a pair of spacers on respective sidewalls of the trench so that a portion of the conductive layer is covered;
    removing a portion of the conductive layer using the spacers and the mask layer as an etching mask to form a first floating gate and a second floating gate on the respective sidewalls of the trench;
    forming a first source/drain region in the substrate at a bottom of the trench;
    forming a first inter-gate dielectric layer on the substrate and over the surface of the trench;
    forming a passivation layer over the first inter-gate dielectric layer;
    removing portions of the passivation layer, the first inter-gate dielectric layer and the tunneling oxide layer until a portion of the substrate at the bottom of the trench is exposed;
    forming a control gate that completely fills the trench, wherein a top section of the control gate is at a level higher than a top section of both the first floating gate and the second floating gate;
    removing the liner layer and the mask layer;
    forming a second inter-gate dielectric layer over the substrate;

forming a first select gate and a second select gate beside respective sidewalls of the spacers, the first floating gate and the second floating gate; and forming a second source/drain region in the substrate on one side of the first select gate and the second select gate.

16. The method of claim 15, wherein a material constituting the passivation layer comprises a semiconductor material or a conductive material.

17. The method of claim 15, wherein a material constituting the passivation layer comprises undoped polysilicon.

18. The method of claim 17, wherein the step of forming the passivation layer comprises performing a chemical vapor deposition process.

19. The method of claim 17, wherein a material constituting the conductive layer and the control gate comprises doped polysilicon.

20. The method of claim 15, wherein the first inter-gate dielectric layer is a composite stack stricture comprising a silicon oxide layer, a silicon nitride layer and another silicon oxide layer.

21. The method of claim 15, wherein a material constituting the second inter-gate dielectric layer comprises a silicon oxide.

22. The method of claim 15, wherein each of the first select gate and the second select gate comprise a doped polysilicon layer and a metal silicide layer.

23. The method of claim 15, wherein a material constituting the liner layer comprises silicon oxide and a material constituting the mask layer comprises silicon nitride.

* * * * *